US011886241B2

(12) United States Patent
Chueh et al.

(10) Patent No.: US 11,886,241 B2
(45) Date of Patent: Jan. 30, 2024

(54) FOLDABLE DISPLAY AND PORTABLE ELECTRONIC DEVICE

(71) Applicant: Acer Incorporated, New Taipei (TW)

(72) Inventors: Yen-Chou Chueh, New Taipei (TW);
Chun-Hsien Chen, New Taipei (TW);
Chi-Tai Ho, New Taipei (TW);
Chih-Heng Tsou, New Taipei (TW);
Chun-Hung Wen, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 18/185,386

(22) Filed: Mar. 17, 2023

(65) Prior Publication Data

US 2023/0221762 A1 Jul. 13, 2023

Related U.S. Application Data

(62) Division of application No. 17/068,791, filed on Oct. 12, 2020, now Pat. No. 11,644,866.

(30) Foreign Application Priority Data

Mar. 11, 2020 (TW) .................................. 109108024

(51) Int. Cl.
*G06F 1/16* (2006.01)
*H05K 5/03* (2006.01)
*H05K 5/02* (2006.01)

(52) U.S. Cl.
CPC .......... *G06F 1/1618* (2013.01); *G06F 1/1616* (2013.01); *G06F 1/1652* (2013.01); *G06F 1/1656* (2013.01); *G06F 1/1681* (2013.01); *H05K 5/0204* (2013.01); *H05K 5/0226* (2013.01); *H05K 5/03* (2013.01)

(58) Field of Classification Search
CPC .... G06F 1/1616; G06F 1/1622; G06F 1/1633; G06F 1/1637; G06F 1/1641; G06F 1/1652; G09F 9/301
See application file for complete search history.

(56) References Cited

U.S. PATENT DOCUMENTS

| 11,442,506 | B1 * | 9/2022 | Hsu | G06F 1/1654 |
| 2018/0275717 | A1 * | 9/2018 | Ram | G06F 1/1681 |
| 2020/0117245 | A1 * | 4/2020 | Ou | H04M 1/0268 |
| 2020/0174531 | A1 * | 6/2020 | Lin | E05D 11/0054 |

* cited by examiner

*Primary Examiner* — Anthony Q Edwards
(74) *Attorney, Agent, or Firm* — JCIPRNET

(57) ABSTRACT

A foldable display including a first bracket, a second bracket, a rotating shaft connecting the first and the second brackets, at least one third bracket screwed to the rotating shaft, a fourth bracket movably coupled to the second and the third brackets, a flexible display disposed on the first and the fourth brackets, and a flexible supporting member disposed on the flexible display to be bent or flattened along with the flexible display is provided. The rotation of the rotating shaft drives the fourth bracket via the third bracket to move relative to the second bracket. The flexible supporting member is filled in a space composed of the fourth bracket, the second bracket, the first bracket, and the flexible display. A portable electronic device is also disclosed.

8 Claims, 12 Drawing Sheets

FOLDABLE DISPLAY AND PORTABLE ELECTRONIC DEVICE

CROSS-REFERENCE TO RELATED APPLICATION

This application is a divisional application of and claims the priority benefit of U.S. application Ser. No. 17/068,791, filed on Oct. 12, 2020, now allowed, which claims the priority benefit of Taiwan application serial No. 109108024, filed on Mar. 11, 2020. The entirety of each of the above-mentioned patent applications is hereby incorporated by reference herein and made a part of this specification.

BACKGROUND OF THE DISCLOSURE

1. Field of the Disclosure

The disclosure relates to a foldable display and a portable electronic device.

2. Description of Related Art

With the progress of technology, a flexible display technology has gradually developed and matured and is considered to have strong development potential. Generally, the flexible display technology includes electronic paper, flexible OLEDs, and the like. In addition, the flexible display technology is widely applied to a portable electronic device according to the requirements of the portable electronic device for functions of bending, folding, stretching and the like on a display device. Meanwhile, along with the application of flexible materials in the field of electronic display, the electronic display device can not only display in a larger area when being stretched, but also be folded as needed to facilitate carrying.

However, corresponding to the stretching and folding of a device mechanism on the flexible display device, a flexible display panel on the flexible display device may also correspondingly vary in shape and size due to its flexible nature, e.g., due to different degrees of bending (flattening), it may be possible to increase or decrease a length relative to the device mechanism. If the electronic device is still designed according to the mechanism characteristics of an existing electronic device, inconvenience in use may be caused, the display panel may also deviate from an original position, and the situations of bulging, wrinkling or even falling off from the mechanism may be caused. Furthermore, an adaptation degree between the flexible display panel and the device mechanism needs to be further considered, so the flexible display panel in a bent or flattened state can be completely matched with and supported by the device mechanism, and damage to the flexible display panel caused by improper design of the device mechanism during operation is avoided.

Based on the above, there is a need in the art for improvements in mechanisms associated with the existing flexible display device to accommodate technology development trends and market demands.

SUMMARY OF THE DISCLOSURE

The disclosure provides a foldable display and an electronic device, which achieve better matching and supporting degree between a mechanism part and the foldable display.

A foldable display of the disclosure includes a first bracket, a second bracket, a rotating shaft connecting the first bracket and the second bracket, at least one third bracket screwed to the rotating shaft, a fourth bracket movably coupled to the second and the third brackets, a flexible display disposed on the first and the fourth brackets, and a flexible supporting member disposed on the flexible display to be bent or flattened along with the flexible display. The rotation of the rotating shaft drives the fourth bracket via the third bracket to move relative to the second bracket. The flexible supporting member is filled in a space composed of the fourth bracket, the second bracket, the first bracket, and the flexible display.

A foldable display of the disclosure includes a first bracket, a second bracket, a rotating shaft connecting the first bracket and the second bracket, at least one third bracket screwed to the rotating shaft, a fourth bracket movably coupled to the second and the third brackets, a flexible display disposed on the first and the fourth brackets, and a supporting member movably disposed on the second bracket and coupled to the third bracket. The first bracket and the second bracket relatively rotate by the rotating shaft to be unfolded and closed. The rotating shaft rotates to drive the third bracket to move along the rotating shaft. The rotation of the rotating shaft drives the fourth bracket and the supporting member via the third bracket to move relative to the second bracket respectively.

A portable electronic device of the disclosure includes a host, a first rotating shaft and a foldable display. The first rotating shaft is connected between the host and the foldable display. The foldable display rotates by the first rotating shaft relative to the host to be unfolded and closed. The first rotating shaft has a first gear. The foldable display includes a first bracket, at least one second bracket and at least one second rotating shaft. The second rotating shaft connects the first bracket and the second bracket. The first bracket and the second bracket relatively rotate by the second rotating shaft to be unfolded and closed. The second rotating shaft has a second gear engaged with the first gear. When the host and the foldable display relatively rotate by the first rotating shaft to be unfolded and closed, the first rotating shaft drives the second rotating shaft via the first gear and the second gear, so that the second bracket rotates relative to the first bracket to be unfolded and closed.

Based on the above, the foldable display connects the first bracket and the second bracket by the rotating shaft, and the third bracket is screwed to the rotating shaft and coupled to the fourth bracket, so that in a process that the first bracket and the second bracket rotate by the rotating shaft to be unfolded and closed, the rotation action of the rotating shaft drives the third bracket to move along the rotating shaft, and the third bracket further drives the fourth bracket to move on the second bracket. In this way, when the flexible display is disposed on the first and the fourth brackets, that is, part of the flexible display at the fourth bracket can move along with the fourth bracket, a size difference caused by conversion of the flexible display between a bent state and a flattened state can be compensated due to movement of the fourth bracket, so that the situations of wrinkling or even falling off in the conversion process of bending or flattening are avoided.

In addition, when the fourth bracket is driven by the third bracket to move back and forth on the second bracket, a space is left between the first bracket and the second bracket after the fourth bracket is far away from the rotating shaft, and the foldable display in the above-mentioned embodiment of the disclosure further fills and compensates for the space by the supporting member or the flexible supporting member, so that when the foldable display is converted from a folded state to the flattened state, the space caused by the fourth bracket being far away from the first bracket is overcome, and therefore the back surface of the flexible display is supported between the first and the fourth brackets by the supporting member or the flexible supporting member besides being fixed on the first and the fourth brackets, so that the possibility that the flexible display is easily damaged by pressing operation because the flexible display is not supported by a component is avoided.

Besides, the supporting member applied to the above-mentioned flexible display is completed by arranging a movable component on the second bracket, or disposing the flexible supporting member on the flexible display to move along with the flexible display.

On the other hand, according to the portable electronic device adopting the foldable display, the second rotating shaft of the foldable display is orthogonal to the first rotating shaft between the foldable display and the host, so when the foldable display is converted between the folded state and the flattened state relative to the host, the first gear on the first rotating shaft is engaged with the second gear on the second rotating shaft, and accordingly the foldable display rotates to be unfolded and closed correspondingly by itself.

Based on the above, the foldable display and the portable electronic device both use the fourth bracket moving away from or close to the rotating shaft (or the first bracket) so as to provide a size compensation effect for the flexible display when the flexible display is converted from being bent to being flattened, that is, the flexible display is not fixed at one place along with stretching and retracting movement of machine body components, so that the flexible display is prevented from being wrinkled or even falling off in the deformation process. In addition, the machine body components with stretching and retracting movement still further fill the space left after unfolding (flattening) by the supporting member, and the movable supporting member or the flexible supporting member can both smoothly make the device components adapt to the deformation process of the flexible display to facilitate operation, thereby providing a sufficient supporting effect for the flexible display.

DESCRIPTION OF THE EMBODIMENTS

Figure 1:
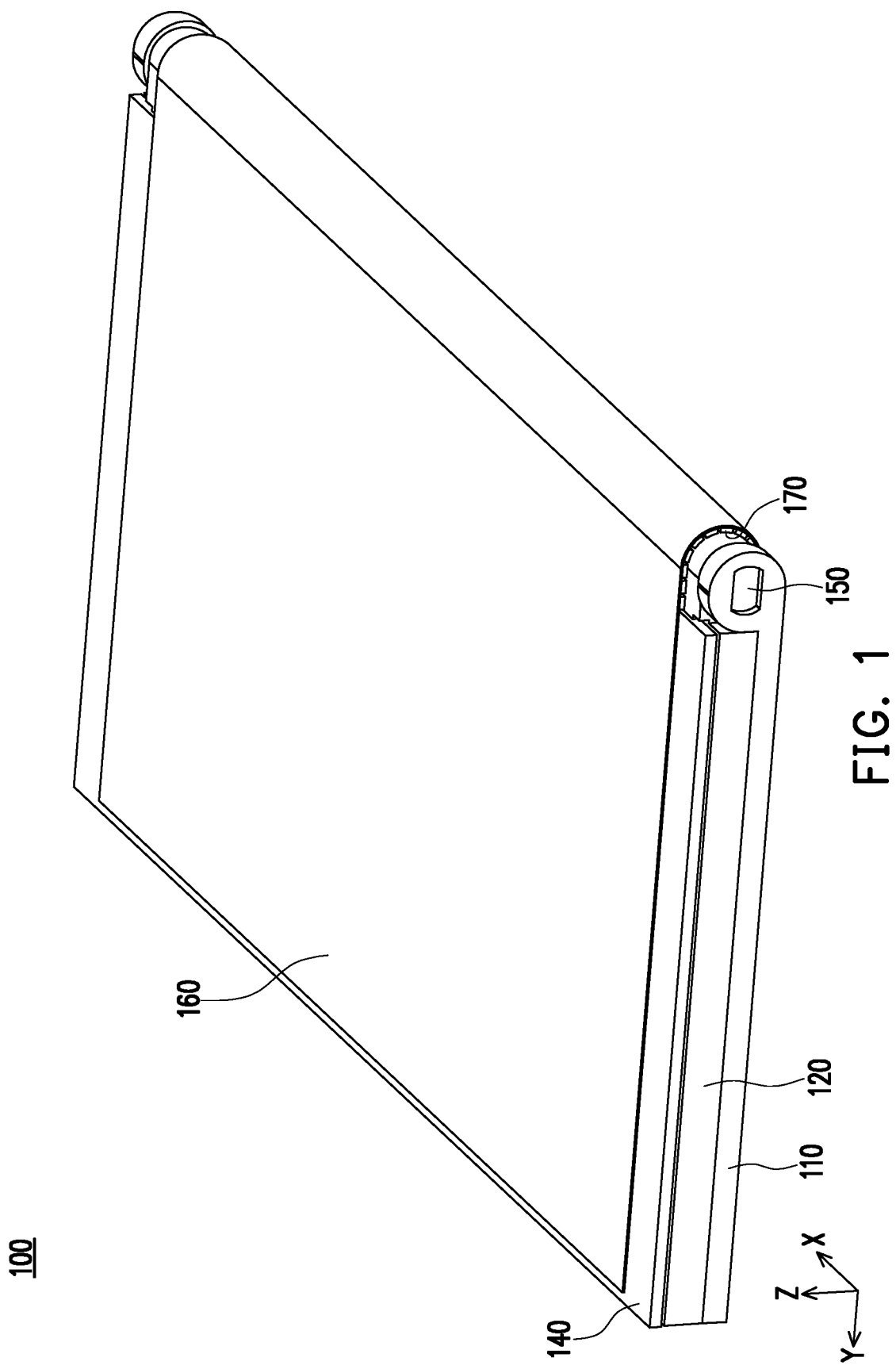
FIG. 1 is a schematic diagram of a foldable display according to one embodiment of the disclosure.
Figure 2:
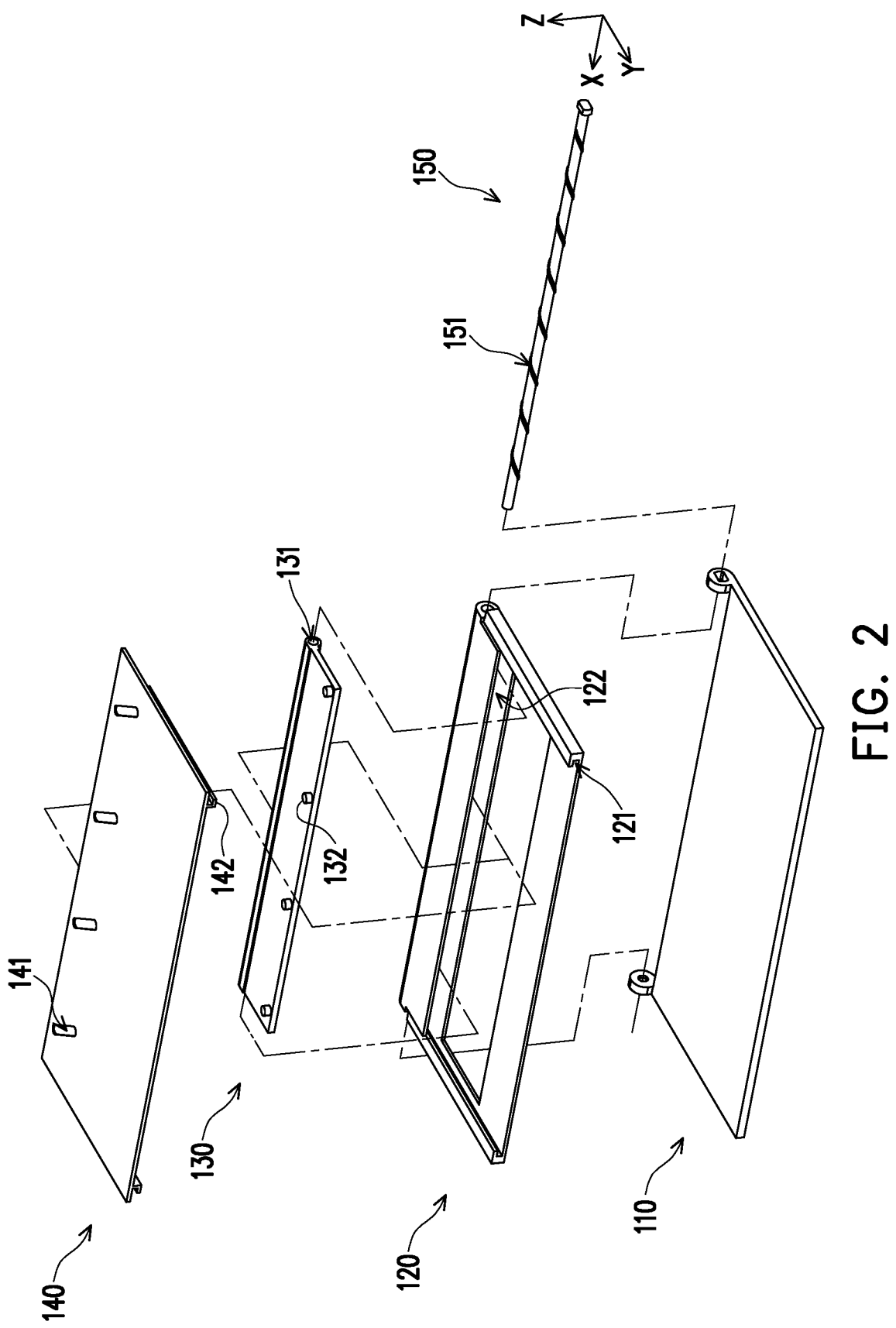
FIG. 2 is an exploded diagram of part of components of the foldable display in FIG. 1.

FIG. 1 is a schematic diagram of a foldable display according to one embodiment of the disclosure. FIG. 2 is an exploded diagram of part of components of the foldable display in FIG. 1. Rectangular coordinates X-Y-Z are provided herein in the component description. Referring to FIG. 1 and FIG. 2 at the same time, in the present embodiment, the foldable display 100 includes a first bracket 110, a second bracket 120, a rotating shaft 150, a third bracket 130, a fourth bracket 140, a flexible display 160, and a flexible supporting member 170, and the rotating shaft 150 connects the first bracket 110 and the second bracket 120, so that the first bracket 110 and the second bracket 120 relatively rotate by the rotating shaft 150 to be unfolded and closed. The third bracket 130 is screwed to the rotating shaft 150, and the rotating shaft 150 rotates to drive the third bracket 130 to move along the rotating shaft 150. The fourth bracket 140 is movably coupled to the second bracket 120 and the third bracket 130. Rotation of the rotating shaft 150 drives the fourth bracket 140 via the third bracket 130 to move relative to the second bracket 120. The flexible display 160 is disposed on the first bracket 110 and the fourth bracket 140. The flexible supporting member 170 is disposed on the flexible display 160 to be bent or flattened along with the flexible display 160.

Figure 3A:
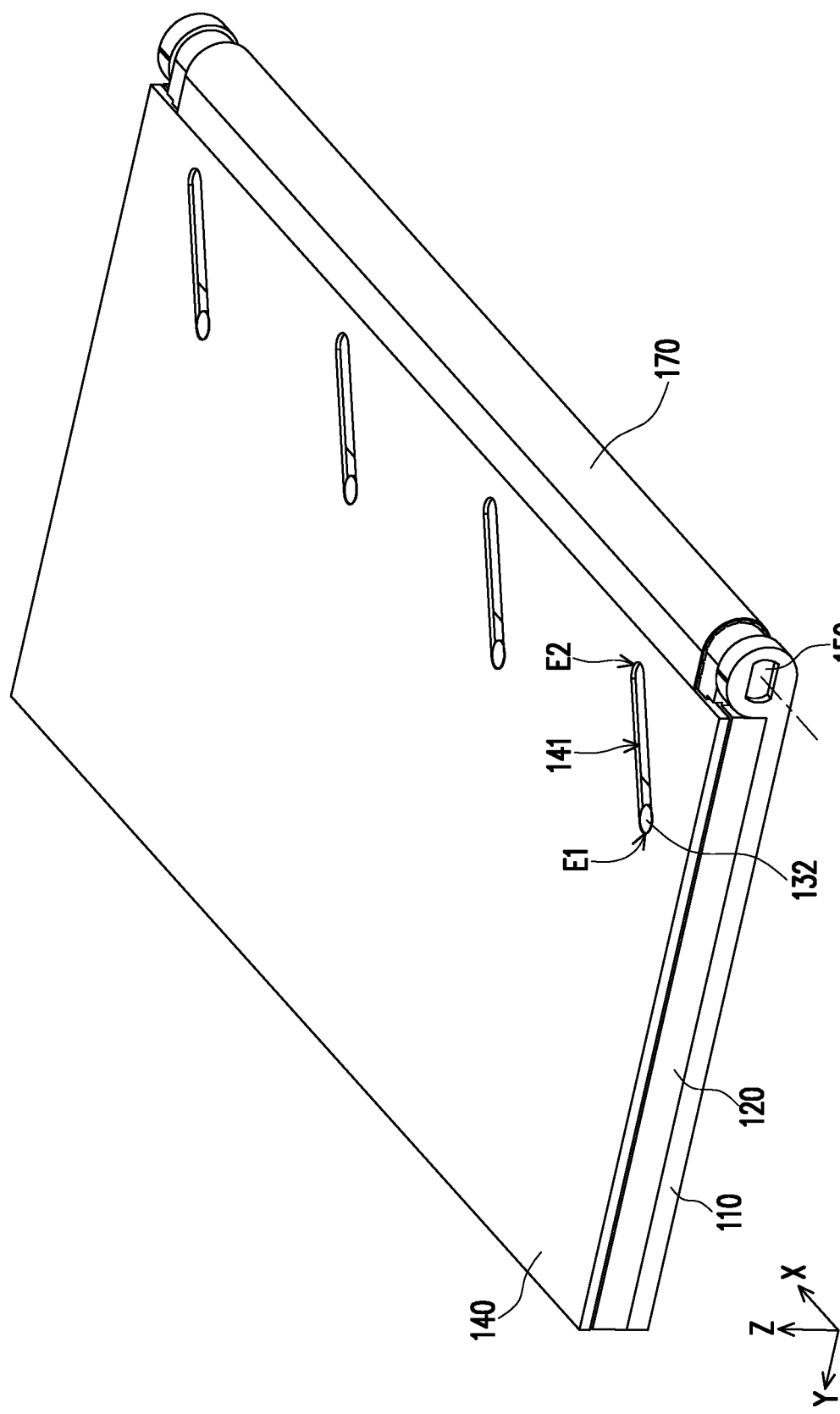
FIG. 3A is a schematic diagram of part of the components of the foldable display in FIG. 1.
Figure 3B:
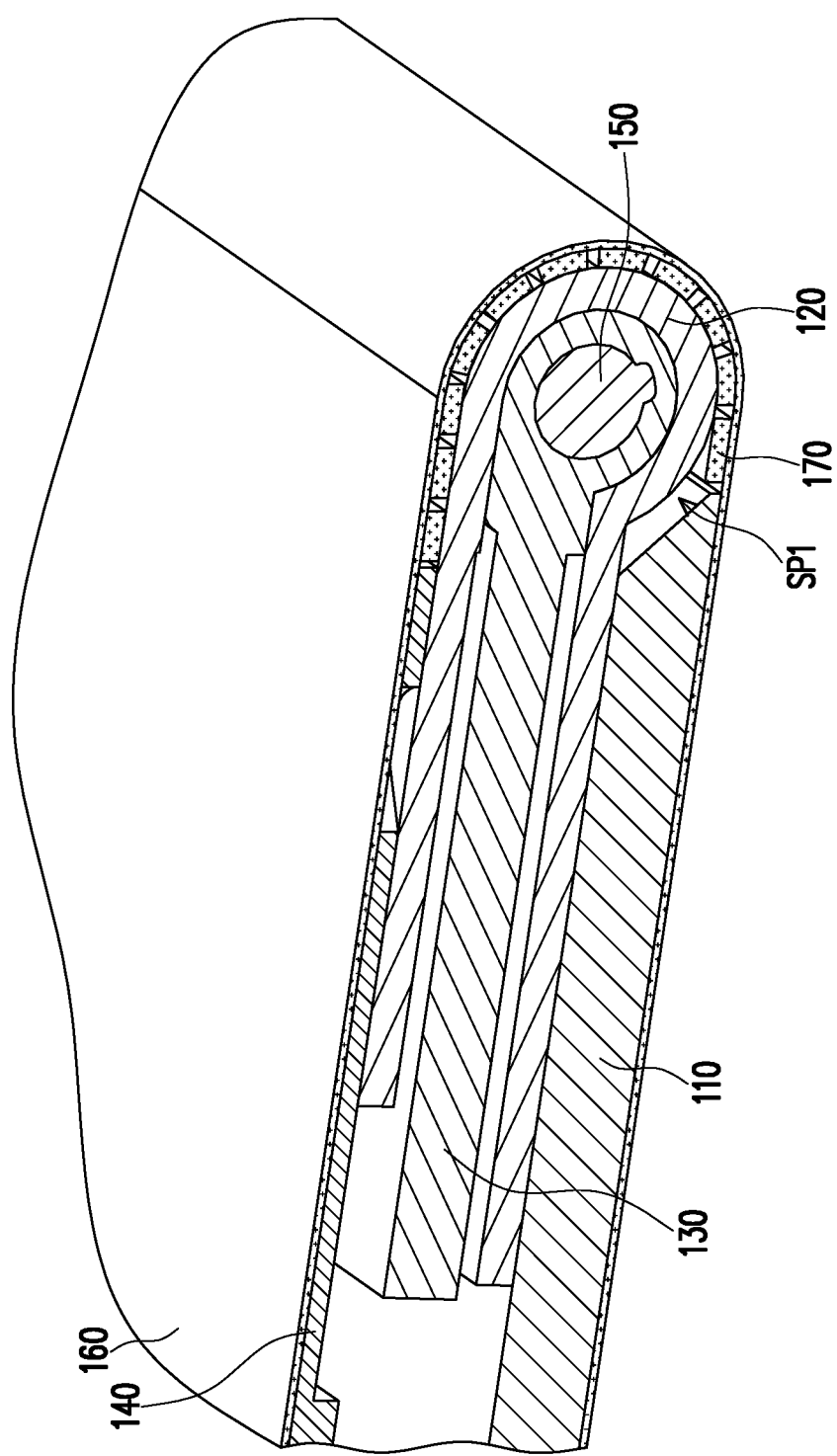
FIG. 3B is a partial cross-sectional view of the foldable display in FIG. 1.
Figure 4:
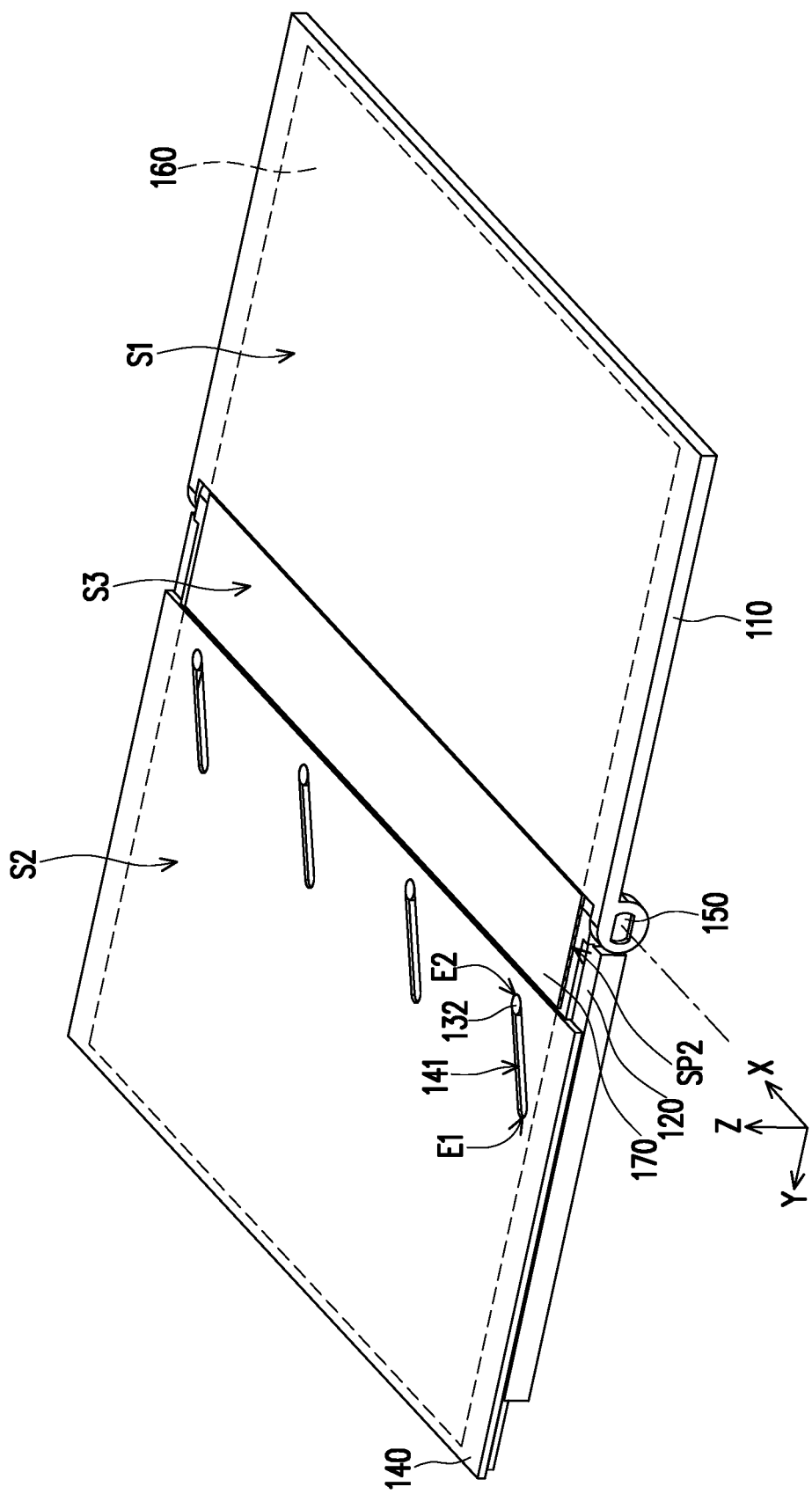
FIG. 4 is a schematic diagram of the foldable display in FIG. 1 in another state.

FIG. 3A is a schematic diagram of part of the components of the foldable display in FIG. 1. FIG. 3B is a partial cross-sectional view of the foldable display in FIG. 1. FIG. 4 is a schematic diagram of the foldable display in FIG. 1 in another state. Referring first to FIG. 2, FIG. 3A and FIG. 4, in detail, the rotating shaft 150 has an external thread 151, and the third bracket 130 is located in a groove 122 of the second bracket 120 and has an internal threaded hole 131 adapting to the external thread 151, so that when the rotating shaft 150 rotates along an X axis, the third bracket 130 is driven to move in the groove 122 along the X axis. Further, the third bracket 130 has guide posts 132, and in addition to the fourth bracket 140 being coupled to guide parts 121 of the second bracket 120 via guide parts 142 to facilitate movement on the second bracket 120 along a Y axis, the fourth bracket 140 has guide grooves 141, so that the guide posts 132 of the third bracket 130 are movably coupled to the guide grooves 141.

The guide grooves 141 are inclined relative to a movement axial direction (i.e., the X axis) of the third bracket 130 (also equivalent to being inclined relative to the rotating shaft 150) herein, and the guide grooves 141 are also inclined relative to a movement axial direction (i.e., the Y axis) of the fourth bracket 140 at the same time. Thus, a movement pattern in which the third bracket 130 moves along the X axis is converted into a movement pattern in which the fourth bracket 140 moves along the Y axis by the adapting and guiding relationship of the guide posts 132 and the guide grooves 141, that is, the movement axial direction of the third bracket 130 and the movement axial direction of the fourth bracket 140 are orthogonal to each other and are converted by the guide grooves 141 and the guide posts 132.

Based on the above, when the rotating shaft 150 rotates along the X axis, the fourth bracket 140 is driven to move along the second bracket 120 via the third bracket 130, for example, the guide post 132 moves from an end E1 of the guide groove 141 shown in FIG. 3A to an end E2 of the guide groove 141 shown in FIG. 4. In other words, the first bracket 110 and the second bracket 120 relatively rotating by the rotating shaft 150 to be unfolded and closed can cause linear movement of the fourth bracket 140 relative to the second bracket 120 (and along the Y axis).

Accordingly, referring to FIG. 1, FIG. 3A and FIG. 4 at the same time, FIG. 1 and FIG. 3A show the foldable display 100 in a folded state in which the second bracket 120 and the first bracket 110 are folded together, the fourth bracket 140 is completely overlapped with the second bracket 120, and the flexible display 160 is in a bent state. In contrast, when the first bracket 110 and the second bracket 120 relatively rotate by the rotating shaft 150 to be unfolded, the first bracket 110 is not overlapped with the second bracket 120 and flattens the flexible display 160, and the fourth bracket 140 moves relative to the second bracket 120 and partially protrudes from the second bracket 120 as described above, so that the fourth bracket and the second bracket are not completely overlapped. On the contrary, when the foldable display 100 makes the flexible display 160 change from the flattened state to the bent state, the fourth bracket 140 is restored from the state shown in FIG. 4 to the state shown in FIG. 3A.

The third bracket 130 and the fourth bracket 140 relatively move because there is a size difference when the flexible display 160 changes to the flattened state due to the influence of the inner diameter and the outer diameter of a bent portion in the bent state, so the fourth bracket 140 needs to move away from the rotating shaft 150 (also equivalent to moving away from the first bracket 110) relatively to protrude from the second bracket 120 so as to compensate for the above size difference, and the flexible display 160 is prevented from being wrinkled or even falling off from the components when being converted from the bent state to the flattened state due to a conventional fixed structure. In other words, if the flexible display 160 is disposed on the first bracket 110 and the second bracket 120, since there is no relative displacement between the first bracket and the second bracket in the process of rotating to be unfolded and closed, the flexible display 160 will wrinkle between the first bracket 110 and the second bracket 120 when being converted from the bent state to the flattened state, and the flexible display 160 even falls off.

It should be noted that the coupling form of the third bracket 130 and the fourth bracket 140 is not limited thereto, and in another embodiment not shown, the third bracket may have guide grooves instead, and the fourth bracket may have guide posts instead.

In addition, it should be noted that the present embodiment provides the flexible supporting member 170 as a compensation structure in order to structurally adapt to a space left between the fourth bracket 140 and the first bracket 110 since the fourth bracket is far away from the rotating shaft when the flexible display 160 is in the flattened state due to the relative movement of the third bracket 130 and the fourth bracket 140 as described above.

Further, referring to FIG. 3B and FIG. 4 at the same time, the flexible supporting member 170 is disposed on the back surface of the flexible display 160 and moves therewith, so that the foldable display 100 is in the folded state shown in FIG. 3B, in which the fourth bracket 140 moves close to the rotating shaft 150, the flexible supporting member 170 is bent along with the flexible display 160 to partially surround the rotating shaft 150, and the flexible supporting member 170 is substantially filled in a U-shaped space SP1 composed of the fourth bracket 140, the second bracket 120, the first bracket 110, and the flexible display 160, so a surface S1 of the first bracket 110, a surface S2 of the fourth bracket 140 and a surface S3 of the flexible supporting member 170 form a same surface, which is a U-shaped surface in this state.

In contrast, when the foldable display 100 is converted to an unfolded state shown in FIG. 4, the flexible supporting member 170 is flattened as the flexible display 160 is unfolded, and since the fourth bracket 140 relatively moves away from the rotating shaft 150 and the first bracket 110, the flexible supporting member 170 is also pulled to a positive Y-axis direction (FIG. 4) by the fourth bracket 140 along with the flexible display 160. The position of the flexible supporting member after being pulled is right between the first bracket 110 and the fourth bracket 140, that is, it is equivalent to filling a space SP2 left by the fourth bracket 140 moving away from the rotating shaft 150, and thus it can also be regarded as filling the space composed of the fourth bracket 140, the second bracket 120, the first bracket 110, and the flexible display 160 at this time. The surface S1 of the first bracket 110, the surface S2 of the fourth bracket 140 and the surface S3 of the flexible supporting member 170 form a same plane, and in the state shown in FIG. 4, the plane is parallel to an X-Y plane.

In the present embodiment, the flexible supporting member 170 may be made of an elastic and flexible material such as foam, Teflon, silica gel, and rubber, or may be made of a soft magnet to be easily accommodated in the space SP1 as the flexible display 160 is converted between the bent state and the flattened state, and also be easily filled in the space SP2 in the flattened state to serve as a supporting structure for the flexible display 160. In addition, the flexible supporting member 170 of the present embodiment may also be an integrated structure with the flexible display 160, that is, the flexible supporting member 170 may be attached to the flexible display 160 through a thin film structure, or may also share a flexible substrate with the flexible display 160, or may be fabricated together with the flexible substrate.

Figure 5A:
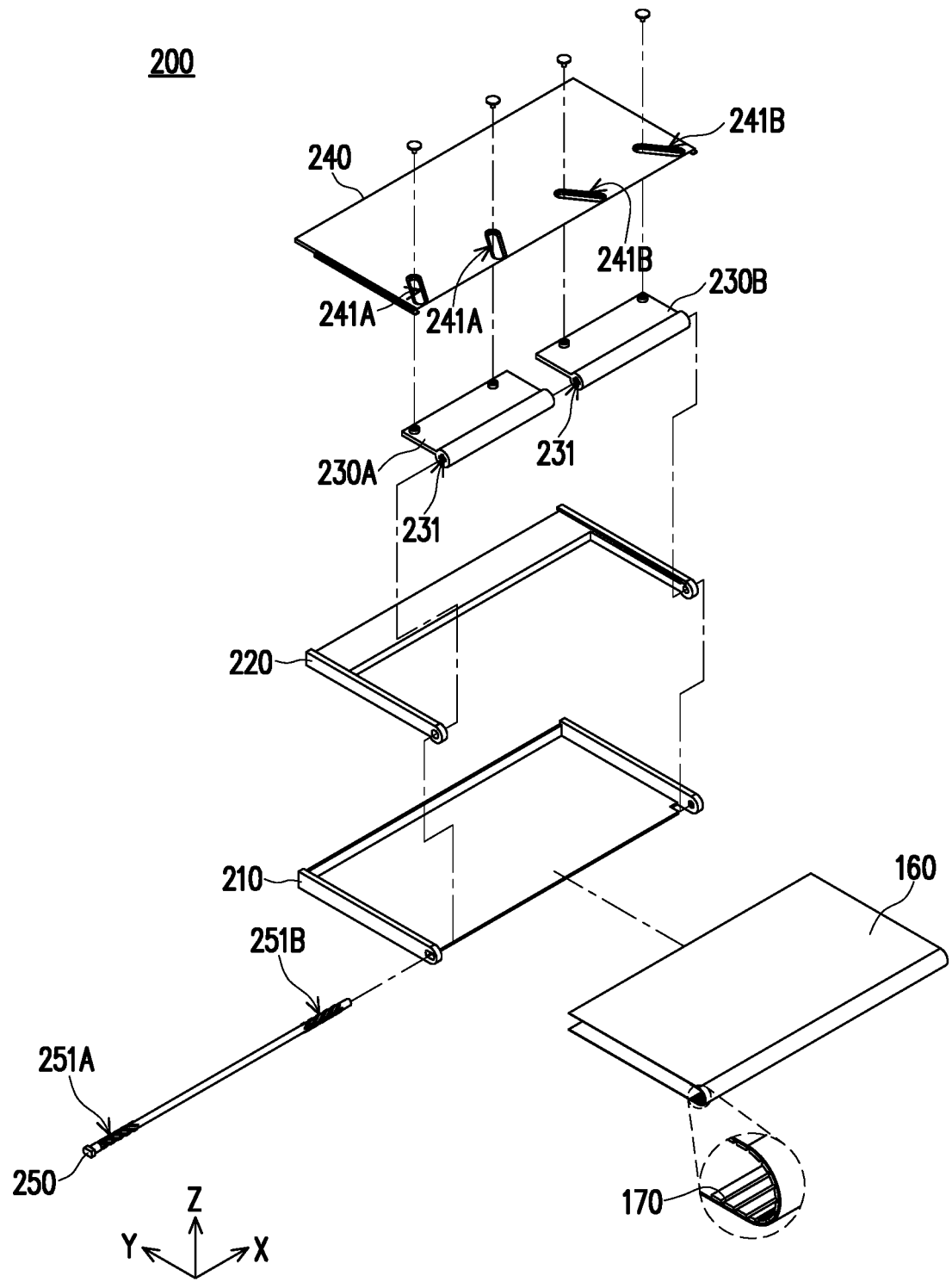
FIG. 5A is a schematic diagram of a foldable display according to another embodiment of the disclosure.
Figure 5B:
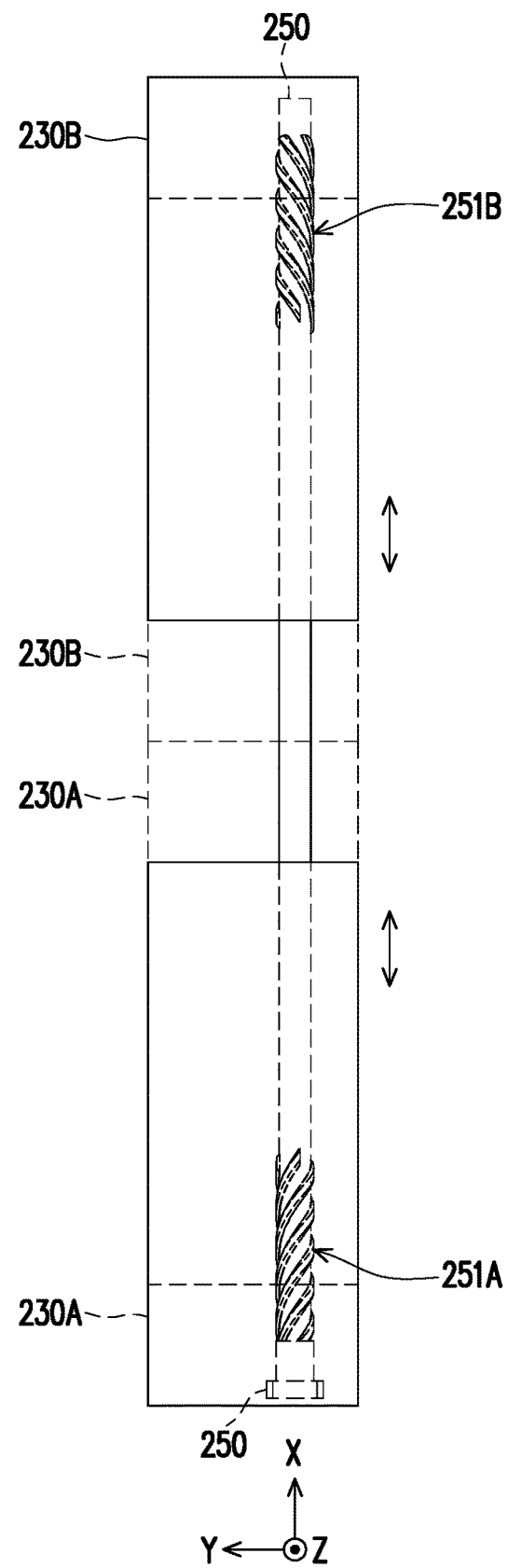
FIG. 5B is a schematic diagram of part of components in FIG. 5A.

FIG. 5A is a schematic diagram of a foldable display according to another embodiment of the disclosure. FIG. 5B is a schematic diagram of part of components in FIG. 5A. Referring to FIG. 5A and FIG. 5B at the same time, in the present embodiment, the foldable display 200 includes a first bracket 210, a second bracket 220, third brackets 230A and 230B, a fourth bracket 240, a rotating shaft 250, a flexible display 160 and a flexible supporting member 170. The flexible display 160 and the flexible supporting member 170 are identical to those of the above-mentioned embodiment, and the first bracket 210 and the second bracket 220 are similar to the first bracket 110 and the second bracket 120 described above and the descriptions thereof are omitted herein. Unlike the above-mentioned embodiment, the present embodiment finishes the same action pattern as the above-mentioned embodiment by matching one pair of third brackets 230A and 230B with the rotating shaft 250 and the fourth bracket 240.

Further, the rotating shaft 250 of the present embodiment has external threads 251A and 251B that are opposite to each other in the spiral direction to correspond to an internal threaded hole 231A of the third bracket 230A and an internal threaded hole 231B of the third bracket 230B respectively. Meanwhile, the fourth bracket 240 has guide grooves 241A and 241B having opposite inclination directions. Guide posts of the third bracket 230A are coupled to the guide grooves 241A, and guide posts of the third bracket 230B are coupled to the guide grooves 241B. Accordingly, as shown in FIG. 5B, when the rotating shaft 250 rotates along an X axis, the third brackets 230A and 230B can be driven to move relative to each other to move close to or away from each other, and are matched with the guide grooves 241A and 241B in different directions at the same time, so that the fourth bracket 240 can achieve the same movement pattern as the above-mentioned embodiment. It can be seen from the above-described embodiment that the number and the movement pattern of the third brackets may be appropriately adjusted according to requirements, and accordingly the inclination state of the guide grooves is correspondingly adjusted, so that the fourth bracket reaches the same movement pattern.

Figure 6A:
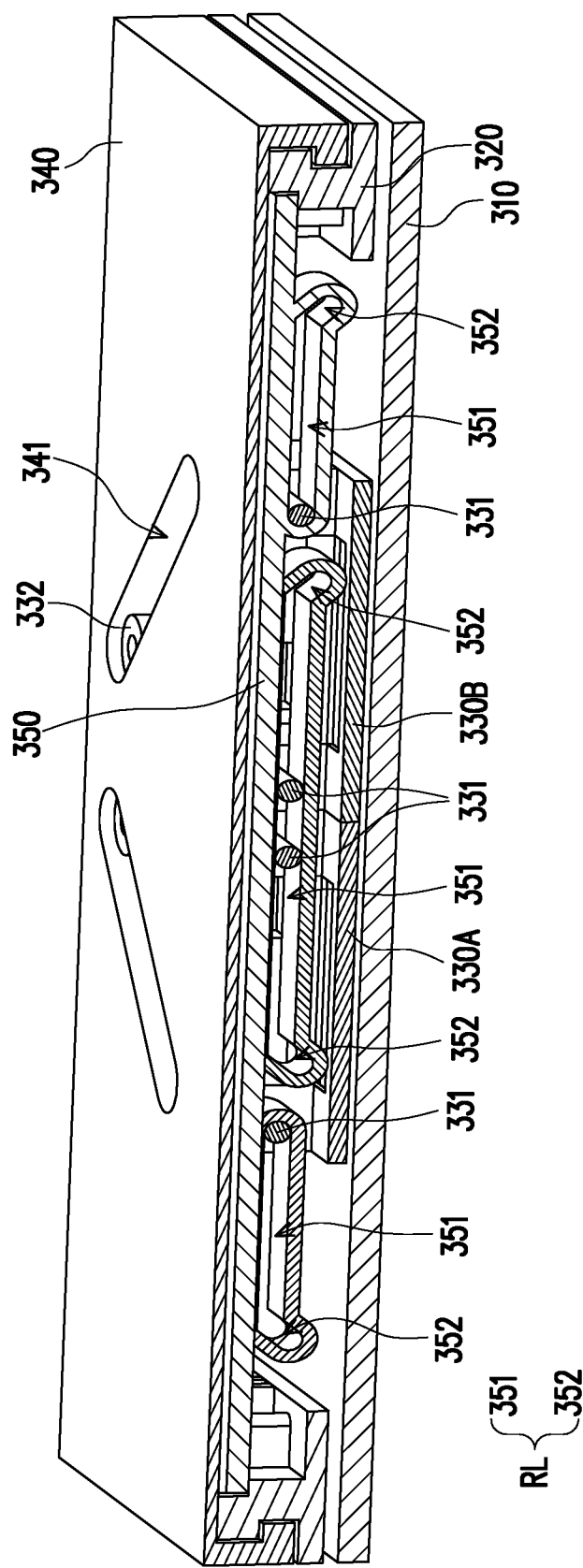
FIG. 6A and FIG. 6B are partial cross-sectional views of a foldable display in different states according to another embodiment of the disclosure.
Figure 6B:
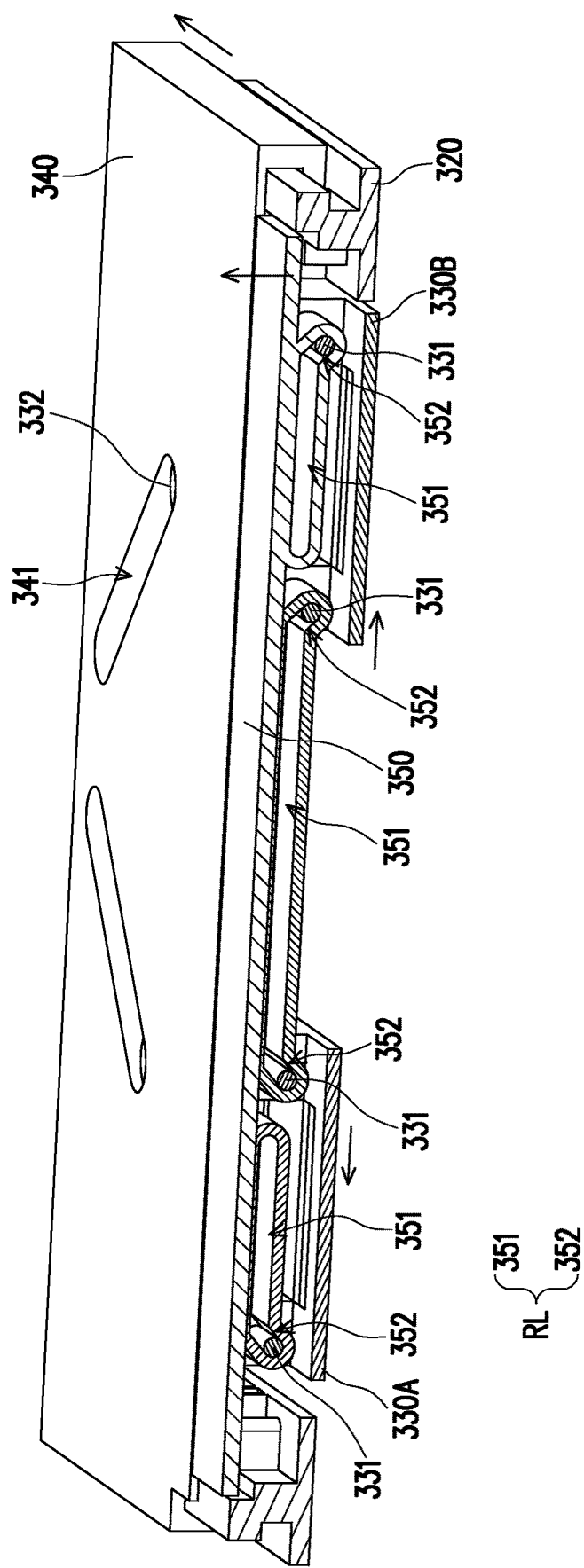

FIG. 6A and FIG. 6B are partial cross-sectional views of a foldable display in different states according to another embodiment of the disclosure. Referring to FIG. 6A and FIG. 6B at the same time, it should be noted first that the present embodiment is similar to the above-mentioned embodiment shown in FIG. 5A and FIG. 5B, one pair of third brackets 330A and 330B corresponds to one pair of guide grooves 341 with different inclination angles of a fourth bracket 340 (one pair of guide posts 332 is correspondingly coupled to the guide grooves 341), so that the kinematic relationship between a first bracket 310, a second bracket 320, the third brackets 330A and 330B and the fourth bracket 340 can be known from the above-mentioned embodiments in FIG. 5A, FIG. 5B, and even FIG. 1 to FIG. 4, and the descriptions thereof are omitted herein.

The difference from the above-mentioned embodiments is that the present embodiment replaces the above-mentioned flexible supporting member 170 with a supporting member 350. The supporting member 350 is movably disposed on the second bracket 320 and coupled to the third brackets 330A and 330B, the part that the rotation of a rotating shaft drives the fourth bracket 340 via the third brackets 330A and 330B can be known from the embodiment shown in FIG. 5A and FIG. 5B, but the difference is that the third brackets 330A and 330B of the present embodiment can further drive the supporting member 350 to move relative to the second bracket 320.

Further, the supporting member 350 has guide grooves RL. Part of the guide grooves RL is inclined relative to a movement axial direction of the third brackets 330A and 330B. The third brackets 330A and 330B have guide posts 331 movably coupled to the guide grooves RL. In the present embodiment, the supporting member 350 has a plurality of guide grooves RL. Each of these guide grooves RL has a first section 351 and a second section 352, and the first section 351 is parallel to the movement axial direction of the third brackets 330A and 330B and the second section 352 is inclined relative to the movement axial direction of the third brackets 330A and 330B, so that the third brackets 330A and 330B can drive the supporting member 350 to move relative to the second bracket 320 when the guide posts 331 move along the second sections 352. In a folded state shown in FIG. 6A, the guide posts 331 are located in the first sections 351, and in an unfolded state shown in FIG. 6B, the guide posts 331 have been moved to the second sections 352. Further, a movement path of the supporting member 350 on the second bracket 320 and a movement path of the fourth bracket 340 on the second bracket 320 are different from each other but are intersected.

As can be seen by comparing the folded state shown in FIG. 6A with the unfolded (flattened) state shown in FIG. 6B, during the conversion from FIG. 6A to FIG. 6B, the rotation of the rotating shaft causes the third brackets 330A and 330B to move away from each other, thereby driving the fourth bracket 340 to move away from the rotating shaft, which is shown in FIG. 5A and FIG. 5B and omitted herein. While the third brackets 330A and 330B move to make the fourth bracket 340 to move away, the second guide posts 331 will thus move from the first sections 351 to the second sections 352. Accordingly, in the process that the first bracket 310 and the second bracket 320 rotate relatively to be unfolded, the fourth bracket 340 moves away from the rotating shaft to create a space so as to expose the supporting member 350. Next, the guide posts 331 move from the first sections 351 to the second sections 352, so that the third brackets 330A and 330B drive the supporting member 350 to ascend and move to the space left when the fourth bracket 340 moves away. In contrast, when the first bracket 310 and the second bracket 320 rotate relatively to be closed (converted from FIG. 6B to FIG. 6A), the guide posts 331 move from the second sections 352 to the first sections 351, so that the third brackets 330A and 330B drive the supporting member 350 to descend and move away from the space, and then the fourth bracket 340 can move close to the rotating shaft and cover (shield) the supporting member 350.

Based on the above, in the present embodiment, the movable supporting member is used instead, is movably disposed on the second bracket 320, and successfully achieves the effect that the third brackets 330A and 330B can simultaneously drive the fourth bracket 340 and the supporting member 350 by the sectional design (the first sections 351 and the second sections 352) with different slopes of the guide grooves RL, so that the movement paths of the fourth bracket 340 and the supporting member 350 on the second bracket 320 respectively are different from each other, are orthogonal but are intersected, and the intersection is the space left after the fourth bracket 340 moves away from the rotating shaft, and the supporting member 350 filled in the space can form a same plane with the fourth bracket 340 and the first bracket 310 so as to meet the requirement of supporting a flexible display.

Based on the above, the flexible supporting members and the supporting member shown in FIG. 1 to FIG. 6B are all configured to be filled in the space between the fourth bracket, the second bracket, the first bracket, and the flexible display, thereby adapting to the space left after the fourth bracket moves away and supporting the flexible display.

Figure 7A:
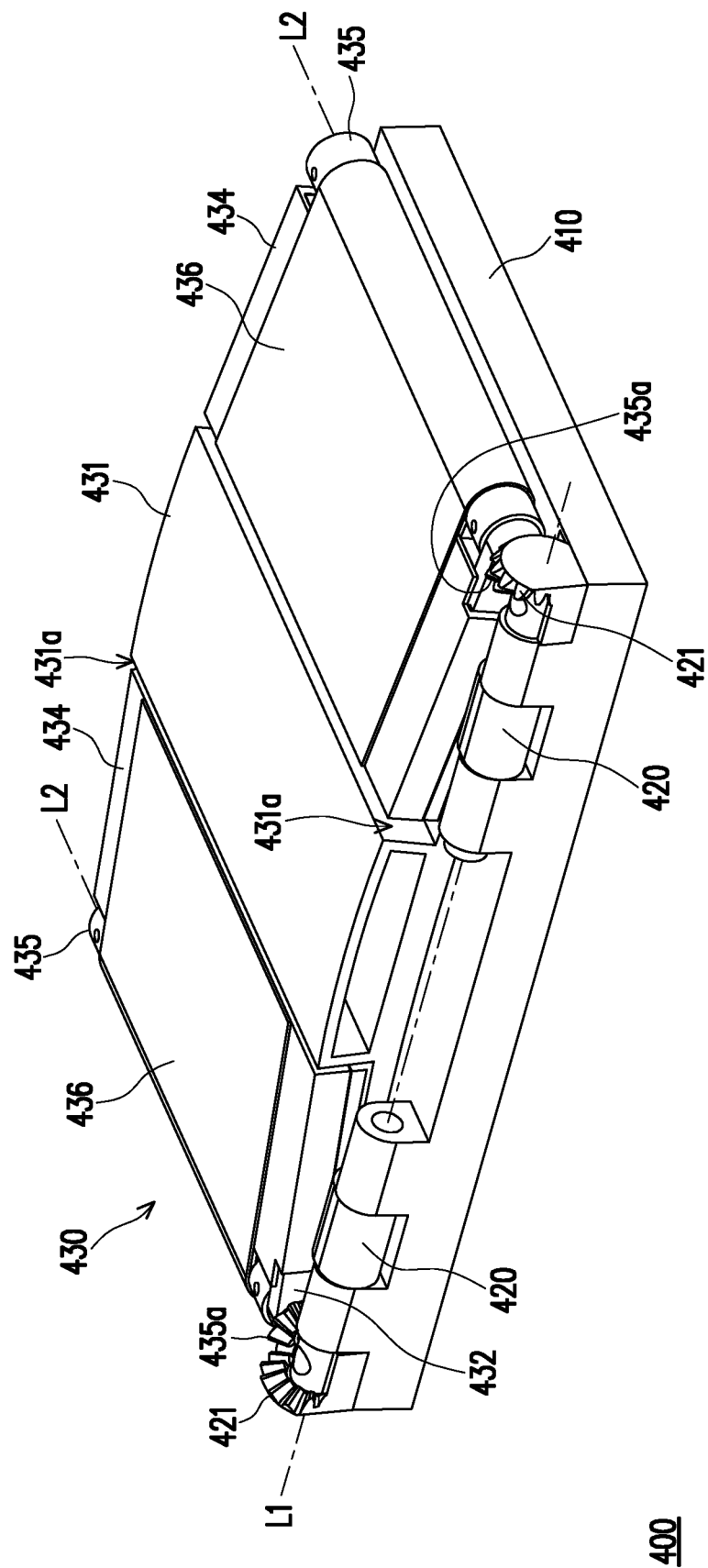
FIG. 7A is a schematic diagram of a portable electronic device according to one embodiment of the disclosure.
Figure 7B:
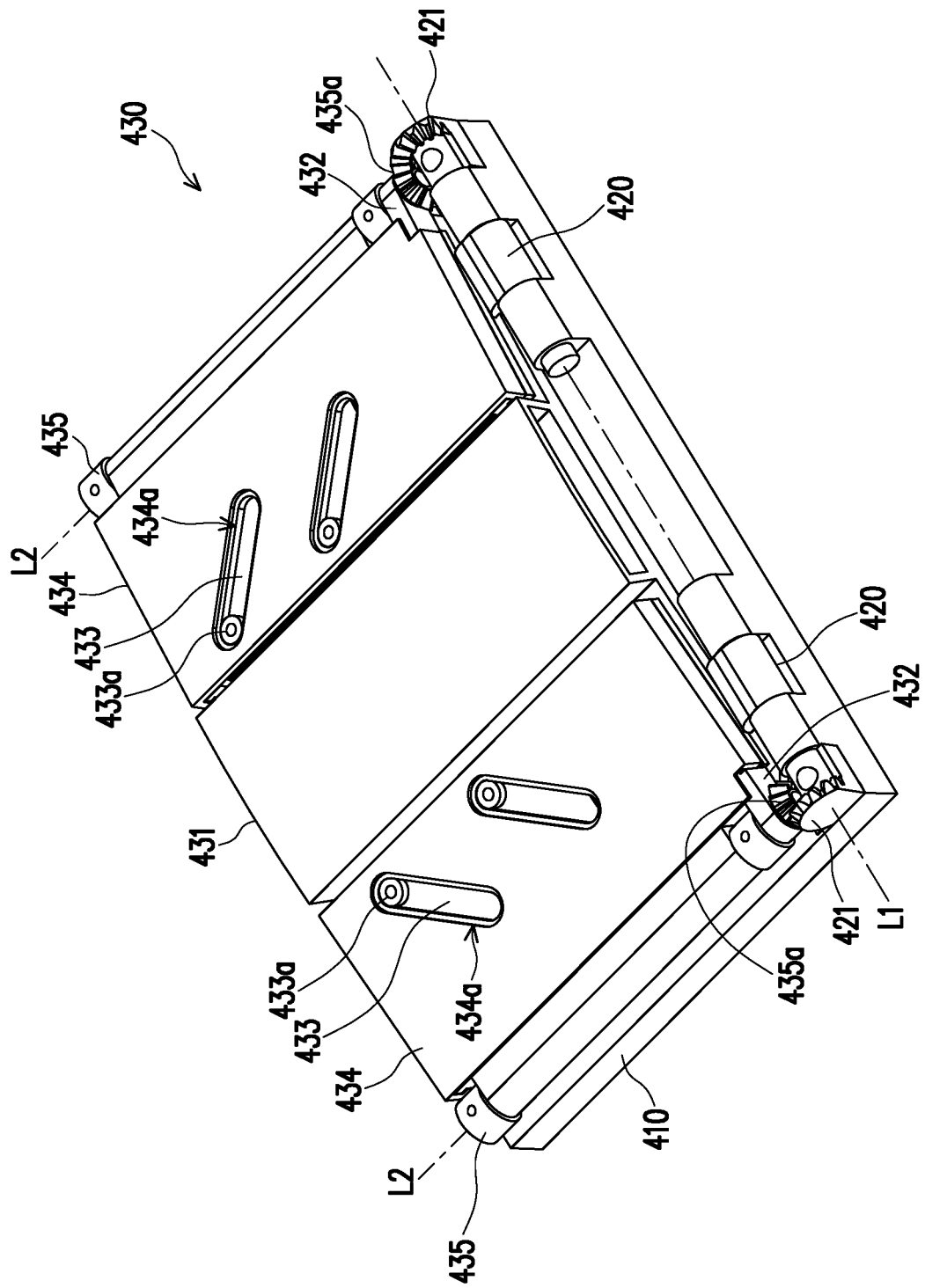
FIG. 7B is a schematic diagram of part of components of the portable electronic device in FIG. 7A.
Figure 7C:
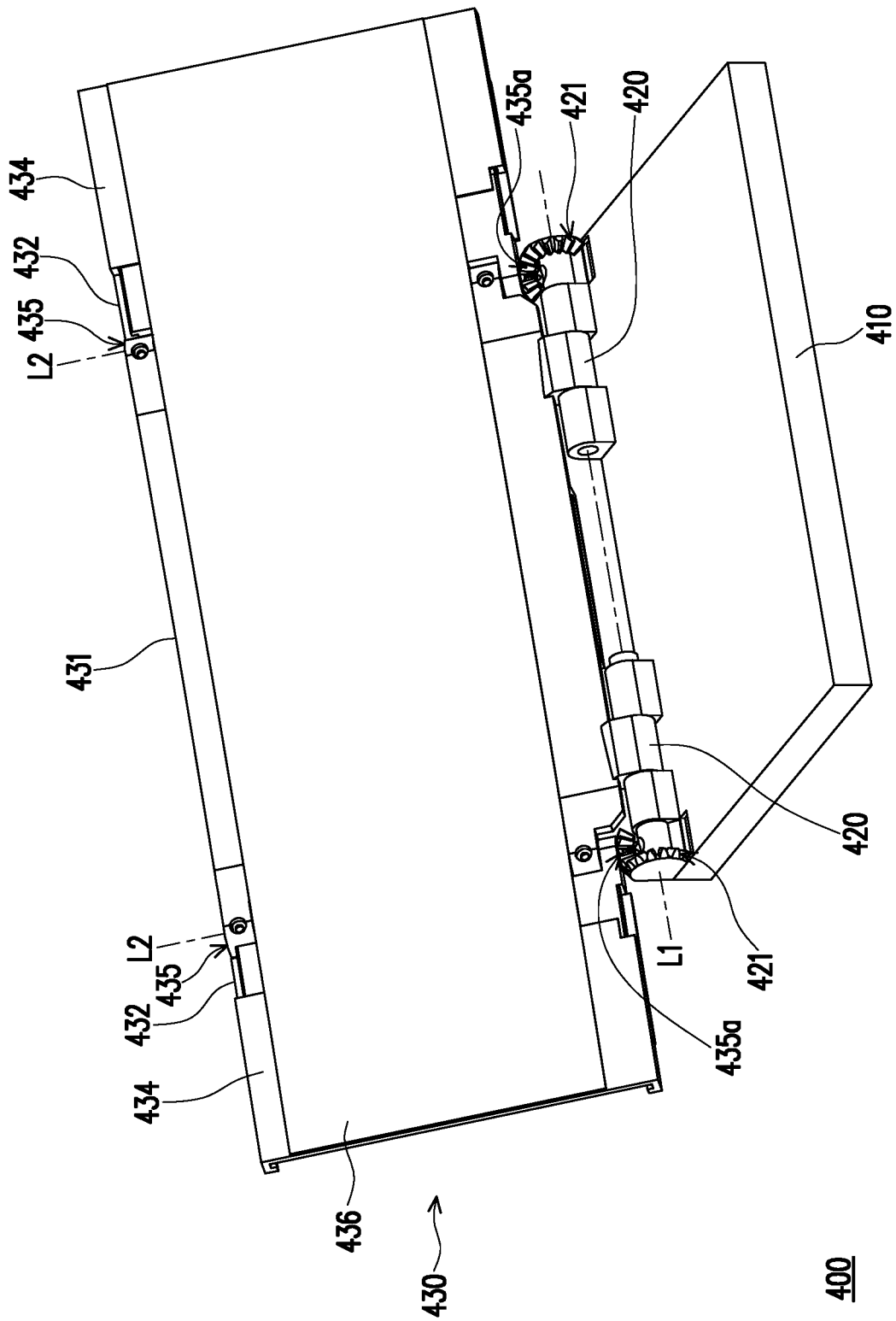
FIG. 7C is a schematic diagram of the portable electronic device in FIG. 7A in another state.

FIG. 7A is a schematic diagram of a portable electronic device according to one embodiment of the disclosure. FIG. 7B is a schematic diagram of part of components of the portable electronic device in FIG. 7A. FIG. 7C is a schematic diagram of the portable electronic device in FIG. 7A in another state. Referring to FIG. 7A to FIG. 7C at the same time, in the present embodiment, the portable electronic device 400 includes a host 410, a foldable display 430 and first rotating shafts 420. The first rotating shafts 420 are connected between the host 410 and the foldable display 430. The foldable display 430 rotates by the first rotating shafts 420 relative to the host 410 to be unfolded and closed, and the first rotating shafts 420 have first gear 421. The foldable display 430 is similar to the above-mentioned foldable display 100 or 200 and includes a first bracket 431, second brackets 432, third brackets 433, fourth brackets 434, second rotating shafts 435, and flexible displays 436. The second rotating shafts 435 connect the first bracket 431 and the second brackets 432. The first bracket 431 and the second brackets 432 relatively rotate by the second rotating shafts 435 to be unfolded and closed. The second rotating shaft 435 has a second gear 435a engaged with the first gear 421, and the first gear 421 is orthogonal to the second gear 435a, that is, the first gear 421 is coaxially arranged with the first rotating shaft 420 (both taking an axis L1 as the rotating center thereof), and the second gear 435a is coaxially arranged with the second rotating shaft 435 (both taking an axis L2 as the rotating center thereof).

Accordingly, the host 410 and the foldable display 430 can relatively rotate by the first rotating shafts 420 to be unfolded and closed, and the first rotating shafts 420 drive the second rotating shafts 435 via the first gear 421 and the second gear 435a, so that the second brackets 432 rotate relative to the first bracket 431 to be unfolded and closed, thereby enabling the unfolding and closing of the foldable display 430 to be in a linkage relationship with the unfolding and closing of the foldable display relative to the host 410. One pair of the second brackets 432, one pair of the third brackets 433, one pair of fourth brackets 434 and one pair of the second rotating shafts 435 are disposed on two opposite sides of the first bracket 431 herein, and the flexible displays 436 are disposed on the first bracket 431 and the two fourth brackets 434, so that a pair of parts of the flexible displays 436 are folded and received in two opposite recesses 431a on the back side of the first bracket 431 along with the second brackets 432, the third brackets 433 and the fourth brackets 434 in a folded state shown in FIG. 7A. Then the foldable display 430 rotates by the first rotating shafts 420 relative to the host 410 to be unfolded as shown in FIG. 7C when a user applies force on the first bracket 431, and the pair of fourth brackets 434 and the first bracket 431 are coplanar and the flexible displays 436 are unfolded and flattened. Of course, in another embodiment not shown, only a first bracket 431 and a second bracket 432, a third bracket 433 and a fourth bracket 434 on one side thereof may be present, while a flexible display is disposed on the first bracket 431 and the fourth bracket 434 on one side.

It should be noted that the present embodiment does not detail the supporting member 350 or the flexible supporting member 170 of the above-mentioned embodiments because the foldable display 430 of the present embodiment operates in a manner that the fourth brackets 434 are allowed to move away from the second rotating shafts 435 to provide a size compensation effect for the flexible displays 436 during the conversion from the folded state to an unfolded state as the above-mentioned embodiments. Therefore, the flexible supporting members 170 shown in FIG. 1 to FIG. 5B, or the supporting member 350 shown in FIG. 6A and FIG. 6B, which can be filled in the space left after the fourth brackets 434 move away, may be actually applied based on demand, so that the flexible displays 436 are completely supported by the structural members (the first bracket 431, the fourth brackets 434 and the supporting members).

Based on the above, in the above-mentioned embodiments of the disclosure, the foldable display and the portable electronic device both use the fourth bracket to moving away from or close to the rotating shaft (or the first bracket) so as to provide a size compensation effect for the flexible display when the flexible display is converted from being bent to being flattened, that is, the flexible display is not fixed at one place along with stretching and retracting movement of machine body components, so that the flexible display is prevented from being wrinkled or even falling off in the deformation process. In addition, the machine body components with stretching and retracting movement still further fill the space left after unfolding (flattening) by the supporting member, and the movable supporting member or the flexible supporting member can both smoothly make the device components adapt to the deformation process of the flexible display to facilitate operation, thereby providing a sufficient supporting effect for the flexible display.

In addition, the rotating shaft of the foldable display is matched with another rotating shaft corresponding to the host, that is, the two rotating shafts are engaged with each other through the gears which are orthogonal to each other, so that the foldable display has the effect of correspondingly rotating to be unfolded and closed in the process of being unfolded and closed relative to the host, a display surface with a larger range is further provided for the portable electronic device, and the display view field of the portable electronic device is developed favourably.

What is claimed is:
1. A portable electronic device, comprising:
   a host;
   a first rotating shaft;
   a foldable display, wherein the first rotating shaft is connected between the host and the foldable display, the foldable display rotates through the first rotating shaft relative to the host to be unfolded and closed, the first rotating shaft has a first gear, and the foldable display comprises:
      a first bracket;
      at least one second bracket; and
      at least one second rotating shaft, connecting the first bracket and the second bracket, the first bracket and the second bracket relatively rotating through the second rotating shaft to be unfolded and closed, and the second rotating shaft having a second gear engaged with the first gear,
   wherein when the host and the foldable display relatively rotate through the first rotating shaft to be unfolded and closed, the first rotating shaft drives the second rotating shaft via the first gear and the second gear, so that the second bracket rotates relative to the first bracket to be unfolded and closed.

2. The portable electronic device according to claim 1, wherein the first gear is orthogonal to the second gear.

3. The portable electronic device according to claim 1, wherein the foldable display further comprises:
   at least one third bracket, screwed to the second rotating shaft, the second rotating shaft rotating to drive the third bracket to move along the second rotating shaft;
   a fourth bracket, movably coupled to the second bracket and the third bracket, wherein rotation of the second rotating shaft drives the fourth bracket via the third bracket to move relative to the second bracket so as to move close to or away from the second rotating shaft, and
   a flexible display, disposed on the first bracket and the fourth bracket, wherein the first bracket and the second bracket relatively rotate to be unfolded and closed to drive the flexible display to be bent or flattened.

4. The portable electronic device according to claim 3, wherein a movement axial direction of the third bracket is orthogonal to a movement axial direction of the fourth bracket, the third bracket has a first guide groove or a first guide post, the fourth bracket has at least one first guide post or a first guide groove, the first guide post is movably coupled to the first guide groove, the first guide groove is inclined relative to the movement axial direction of the third bracket, and the first guide groove is inclined relative to the movement axial direction of the fourth bracket.

5. The portable electronic device according to claim 3, further comprising:
   a flexible supporting member, disposed on the flexible display to be bent or flattened along with the flexible display and filled in a space composed of the fourth bracket, the second bracket, the first bracket, and the flexible display, wherein the first bracket, the flexible supporting member and the fourth bracket form the same surface, when the first bracket and the second bracket relatively rotate to be unfolded, the surface is a plane, and when the first bracket and the second bracket relatively rotate to be closed, the surface is a U-shaped surface surrounding the rotating shaft.

6. The portable electronic device according to claim 3, further comprising:

a supporting member, movably disposed on the second bracket and coupled to the third bracket, wherein the rotation of the second rotating shaft drives the supporting member via the third bracket to move relative to the second bracket, the supporting member has a second guide groove, a part of the second guide groove is inclined relative to a movement axial direction of the third bracket, and the third bracket has a second guide post movably coupled to the second guide groove.

7. The portable electronic device according to claim 6, wherein the second guide groove has a first section and a second section, the first section is parallel to the movement axial direction of the third bracket, the second section is inclined relative to the movement axial direction of the third bracket, the second guide post moves along the second section to make the third bracket drive the supporting member to move relative to the second bracket, when the first bracket and the second bracket are relatively closed to bend the flexible display, the second guide post is located in the first section, and the fourth bracket is completely overlapped with the second bracket and shields the supporting member, and when the first bracket and the second bracket are relatively unfolded to flatten the flexible display, the second guide post is located in the second section, the fourth bracket is partially overlapped with the second bracket and exposes the supporting member, and the fourth bracket, the supporting member and the first bracket are coplanar to support the flexible display.

8. The portable electronic device according to claim 6, wherein a movement path of the supporting member on the second bracket and a movement path of the fourth bracket on the second bracket are different from each other but are intersected.

* * * * *